United States Patent
Walker

(10) Patent No.: US 7,538,581 B2
(45) Date of Patent: May 26, 2009

(54) FAST AC COUPLED LEVEL TRANSLATOR

(75) Inventor: James T. Walker, Palo Alto, CA (US)

(73) Assignee: Supertex, Inc., Sunnyvale, CA (US)

( * ) Notice: Subject to any disclaimer, the term of this patent is extended or adjusted under 35 U.S.C. 154(b) by 0 days.

(21) Appl. No.: 11/831,011

(22) Filed: Jul. 31, 2007

(65) Prior Publication Data

US 2008/0030229 A1    Feb. 7, 2008

Related U.S. Application Data

(60) Provisional application No. 60/821,007, filed on Aug. 1, 2006.

(51) Int. Cl.
*H03K 19/094*    (2006.01)

(52) U.S. Cl. .................. 326/68; 326/80; 327/333

(58) Field of Classification Search .............. 326/68, 326/80–83, 86, 87; 327/108, 109, 333
See application file for complete search history.

(56) References Cited

U.S. PATENT DOCUMENTS

| | | | | |
|---|---|---|---|---|
| 4,800,303 | A * | 1/1989 | Graham et al. | 326/72 |
| 6,351,138 | B1 * | 2/2002 | Wong | 326/30 |
| 6,429,678 | B1 * | 8/2002 | Wong et al. | 326/30 |
| 2002/0097212 | A1 * | 7/2002 | Miyazawa et al. | 345/92 |
| 2005/0122133 | A1 * | 6/2005 | Eldredge et al. | 326/63 |
| 2005/0206432 | A1 * | 9/2005 | Tobita | 327/333 |

* cited by examiner

*Primary Examiner*—Rexford Barnie
*Assistant Examiner*—Jany Tran
(74) *Attorney, Agent, or Firm*—Jeffrey D. Moy; Weiss & Moy, P.C.

(57) ABSTRACT

A level translator has a pair of transistors, wherein a first transistor of the pair of transistors and a second transistor of the pair of transistors are complimentary. A pair of capacitors are provided, wherein a first capacitor of the pair of capacitors is coupled to a voltage input VIN and to a gate of a first transistor of the pair of complimentary transistors and a second capacitor of the pair of capacitors is coupled the voltage input VIN and to a gate of a second transistor of the pair of complimentary transistors. A flip flop device is provided having a first input coupled to a drain of the first transistor, and a second input coupled to a drain of the second transistor. A pair of resistors is provided, wherein a first resistor of the pair of resistors is coupled to the gate of the first transistor and to a voltage supply of VDD, and a second resistor of the pair of resistors is coupled to the gate of the second transistor and to a voltage supply VSS. A pair of clamping circuits is provided, wherein a first clamping circuit of the pair of clamping circuits is coupled to the gate of the first transistor and to a voltage supply of VDD, and a second clamping circuit of the pair of clamping circuits is coupled to the gate of the second transistor and to a voltage supply VSS.

20 Claims, 4 Drawing Sheets

LEVEL TRANSLATOR

LEVEL TRANSLATOR WITH SUPPLY VOLTAGE CHANGE DETECTOR

US 7,538,581 B2

FAST AC COUPLED LEVEL TRANSLATOR

RELATED APPLICATION

This application is related to U.S. Provisional Application Ser. No. 60/821,007, filed Aug. 1, 2006, in the name of the same inventor listed above, and entitled, "A FAST AC COUPLED LEVEL TRANSLATOR". The present patent application claims the benefit under 35 U.S.C. §119(e).

FIELD OF THE INVENTION

This invention relates to level translators and, more specifically, to a high speed AC coupled logic level translator that is useful for high speed, high current CMOS drivers used for applications such as medical ultrasound and non-destructive testing, where MOSFET power transistors must be driven quickly with signals originating in low voltage logic circuits. Additional applications in switch mode power supplies and other circuits requiring the fast switching of MOSFET power transistors are possible.

BACKGROUND OF THE INVENTION

The growth of digital ICs that feature incompatible voltage rails, lower voltage rails, or dual rails has made the translation of logic levels necessary. The use of mixed-signal ICs with lower supply voltages that have not kept pace with those of their digital counterparts also creates the need for logic-level translation.

Because of the above problems, logic level translators have been designed. Logic level translators are able to adapt or convert one voltage or logic level to another. Logic level translators are generally used in devices that operate at multiple voltage levels. Devices that often use logic level translators include microprocessors and integrated circuits that have inputs and outputs functioning at 1.8 volts and logic levels for flash memory or panel display requiring 3.3 volts. These mismatched voltages can be mitigated between the integrated circuit (IC) and the device by using the logic level translator.

Presently there is a need for a high speed AC coupled logic level translator. A high speed AC coupled logic level translator would be particularly useful for high speed, high current CMOS drivers used for applications where MOSFET power transistors must be driven quickly with signals originating in low voltage logic circuits. The capability is provided for enabling the fast digital signal to cross over a high voltage barrier between two different supply voltage groups and still retain its signal transition speeds.

Therefore, a need existed to provide a device and method that provides the above features.

SUMMARY OF THE INVENTION

A level translator has a pair of transistors, wherein a first transistor of the pair of transistors and a second transistor of the pair of transistors are complimentary. A pair of capacitors are provided, wherein a first capacitor of the pair of capacitors is coupled to a voltage input VIN and to a gate of a first transistor of the pair of complimentary transistors and a second capacitor of the pair of capacitors is coupled the voltage input VIN and to a gate of a second transistor of the pair of complimentary transistors. A flip flop device is provided having a first input coupled to a drain of the first transistor, and a second input coupled to a drain of the second transistor. A pair of resistors is provided, wherein a first resistor of the pair of resistors is coupled to the gate of the first transistor and to a voltage supply of VDD, and a second resistor of the pair of resistors is coupled to the gate of the second transistor and to a voltage supply VSS. A pair of clamping circuits is provided, wherein a first clamping circuit of the pair of clamping circuits is coupled to the gate of the first transistor and to a voltage supply of VDD, and a second clamping circuit of the pair of clamping circuits is coupled to the gate of the second transistor and to a voltage supply VSS.

A complementary MOS field effect transistor amplifier for AC input signals has a voltage detection circuit. The voltage detection circuit has a first transistor having a first predetermined voltage threshold and a second transistor having a second predetermined voltage threshold. The first and second transistors have control gates and are of complementary conductivity. A first coupling capacitor is coupled to the gate of the first transistor. A second coupling capacitor is coupled to the gate of the second transistor. A first resistor is coupled to the gate of the first transistor and to a source of the first transistor. A second resistor is coupled to the gate of the second transistor and to a source of the second transistor. A first clamp circuit is coupled to the gate of the first transistor for limiting a gate voltage of the first transistor. A second clamp circuit is coupled to the gate of the second transistor for limiting a gate voltage of the second transistor.

The present invention is best understood by reference to the following detailed description when read in conjunction with the accompanying drawings.

DETAILED DESCRIPTION

Figure 1:
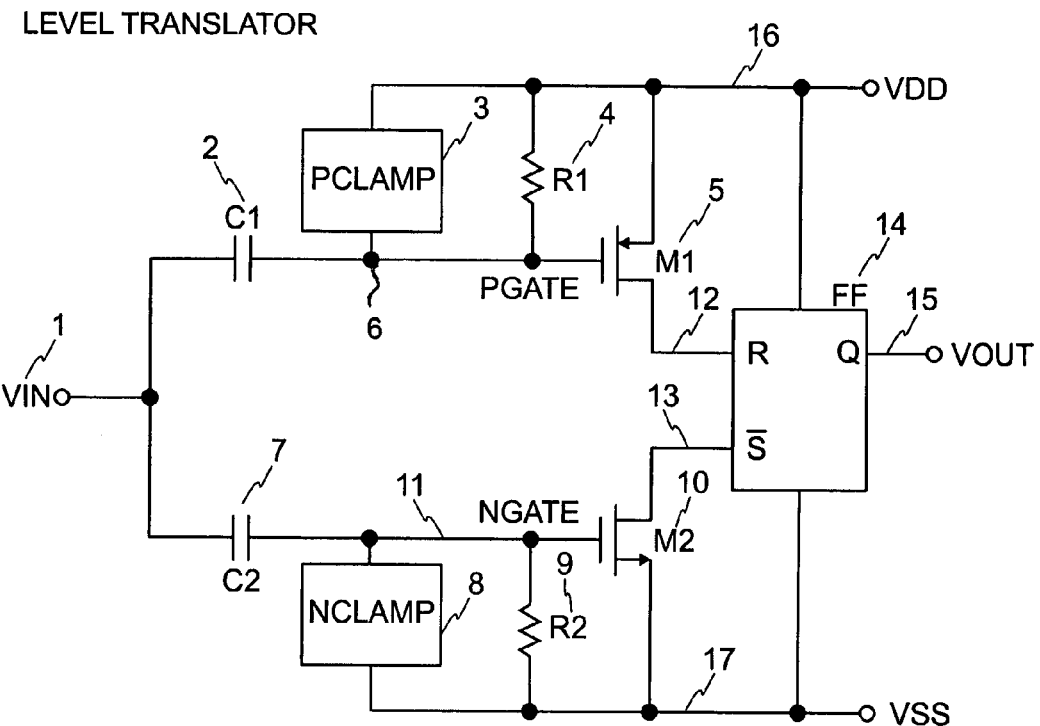
FIG. 1 is a simplified functional block diagram of a level translator of the present invention.

Referring FIG. 1, a simplified schematic of one embodiment of the fast level translator 100 is shown. The input signal VIN at 1 is the input signal with a typical voltage swing of 0 to 5 volts. The fast transitions of the input signal are coupled by capacitors C1 and C2 to the gates of a complementary set of MOS transistors. Capacitor C1, denoted 2, couples negative going pulse edges to node 6 to drive the gate of PMOS transistor M1, denoted 5. Presence of resistor R1, denoted 4, causes the applied pulse edges on node 1 to be differentiated, so that they persist for only a short time at node 6. Positive going edges furthermore are clamped by the clamping device PCLAMP, denoted 3, to reduce the time required for capacitor 2 to recharge. In a similar manner, capacitor C2, denoted 7, couples positive going pulse edges to node 11 to drive the gate of NMOS transistor M2, denoted 10. Presence of resistor R2, denoted 9, causes the applied pulse edges on node 1 to be differentiated, so that they persist for only a short time at node 11. Negative going edges furthermore are clamped by the clamping device NCLAMP, denoted 8, to reduce the time required for capacitor 7 to recharge.

The resultant negative going pulse at node 6 connects to the gate of transistor 5, causing it to momentarily conduct current from node 12. This current pulse connects to the active high reset input of a bi-stable or flip-flop device FF, denoted 14, causing its Q output 15 to go to a logic low state. In a similar manner, the resultant positive going pulse at node 11 connects to the gate of transistor 10, causing it to momentarily conduct current from node 13. This current pulse connects to the active low set input of the flip-flop 14, causing its Q output 15 to go to a logic high state. The result of these two connections is that when VIN on node 1 makes a low to high transition, the output signal VOUT makes a low to high transition, and when VIN makes a high to low transition, VOUT makes a high to low transition. The logic high state of VOUT is the supply voltage VDD and the logic low state of VOUT is the supply voltage VSS for typical circuitry fabricated with complementary MOS transistors. The logic low and high state voltages on VIN are not important so long as the transitions between them are sufficient in amplitude to activate transistors 5 and 10.

Figure 2:
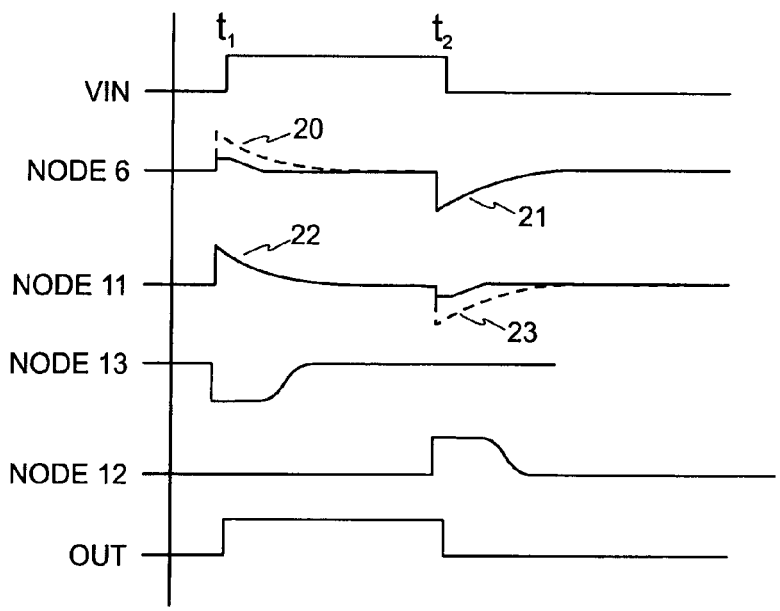
FIG. 2 shows the voltages at various nodes in the level translator of FIG. 1 as the input signal VIN changes state.

Referring now to FIG. 2, the voltages at various nodes in the above described circuit are shown as the input signal VIN changes state. The top trace shows the input signal VIN making a positive going transition at time t1, and a negative going transition at time t2. The result of these input transitions at node 6 is shown in the next trace. At time t1, a differentiated positive going signal would occur, marked as 20, if the clamp circuit 3 were not present. Presence of the clamp causes the positive going pulse amplitude at node 6 to be attenuated, recovering more quickly as shown in the solid line trace. At time t2, a differentiated negative going pulse occurs, marked 21. This pulse is of sufficient amplitude to cause transistor 5 to turn on for a short time. The time constant required for this pulse to return to its baseline value is primarily set by the product of the values of capacitor 2 and resistor 4, if the VIN signal has a sufficiently fast transition.

The next down trace shows the voltage at node 11 resulting from the VIN signal. At time t1, a differentiated positive going signal occurs, marked as 22. This pulse is of sufficient amplitude to cause transistor 10 to turn on for a short time. The time constant required for this pulse to return to its baseline value is primarily set by the product of the values of capacitor 7 and resistor 9, if the VIN signal has a sufficiently fast transition. At time t2, a differentiated negative going pulse occurs, marked 23, if the clamp circuit 3 were not present. Presence of the clamp causes the negative going pulse amplitude at node 11 to be attenuated, recovering more quickly as shown in the solid line trace.

The next trace shows the current flow at node 13. This pulse is caused by the signal 22 at node 11 briefly turning on transistor 10. In a similar manner, the next trace shows the current flow at node 12. This current pulse is caused by the signal 21 at node 6 briefly turning on transistor 5. These two current pulses combine in flip-flop 14 to produce a composite output signal shown in the last trace for VOUT. The resulting signal at node 15 is then the desired result, being a copy of the input signal timing, with voltage levels set by VDD and VSS. An inherent time delay may occur in the signal propagation depending on the time response of the transistors 5 and 10 and the flip-flop 14.

Figure 3:
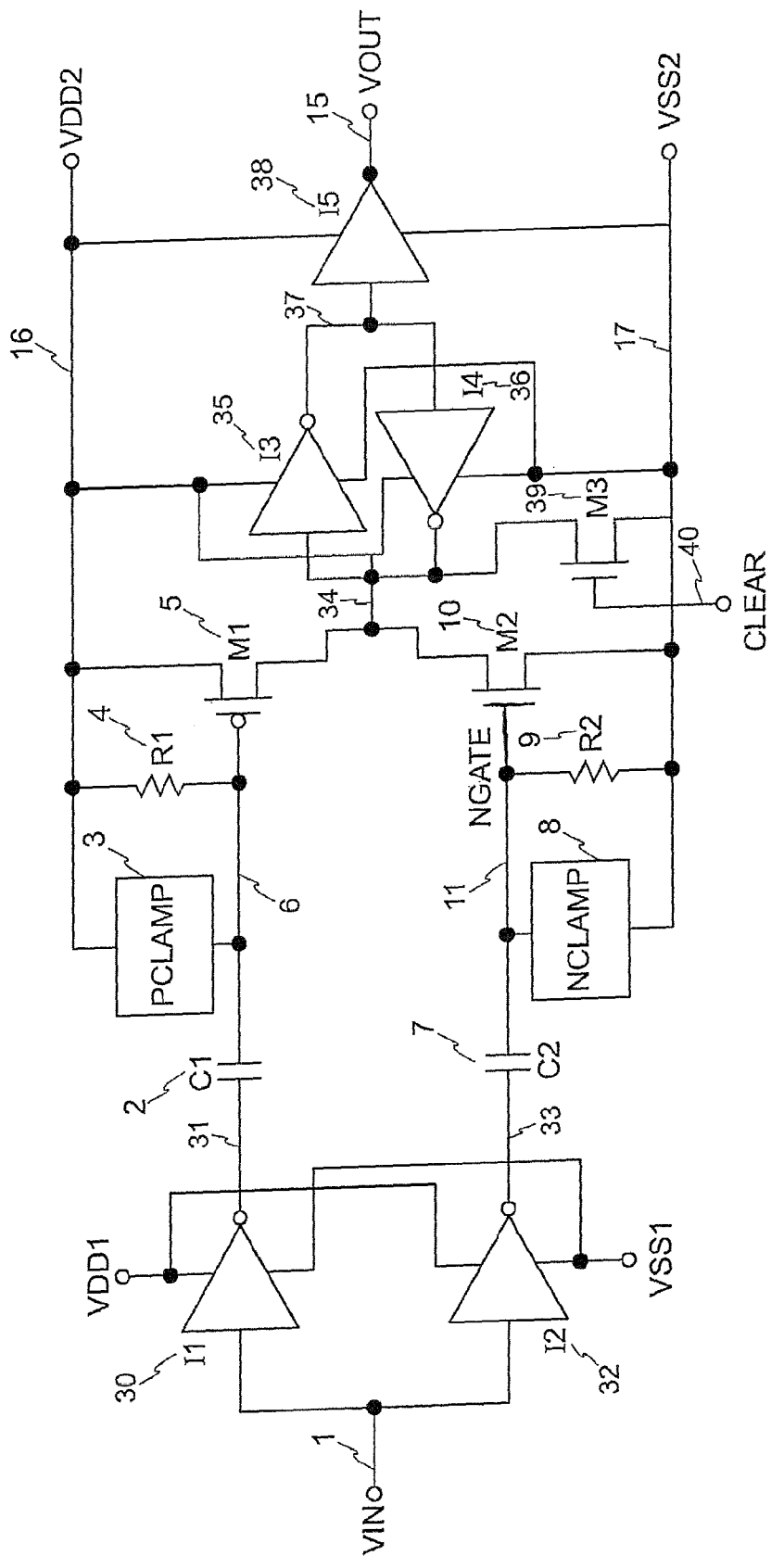
FIG. 3 is a simplified function block diagram of another embodiment of the level translator of the present invention.

Referring to FIG. 3, another implementation of the level translator circuit 300 of FIG. 1 is shown. This is one of many circuits which may occur to a person experienced in the state of the art. In this circuit, original nodes and objects which are not changed have the same designators and waveforms as before. More detail has been shown so that a means of practical implementation of the circuit of FIG. 1 is obvious. For this circuit, the input signal VIN first goes to a pair of CMOS inverter gates I1, denoted 30, and 12, denoted 32, made as is known in the state of the art from complementary NMOS and PMOS transistors. Inverter 30 drives node 31, which serves as the signal source for capacitor 2. This inverter is powered by the signals VDD1 and VSS1. In a similar manner, inverter 32 drives node 33, which serves as the signal source for capacitor 7, and is also powered by VDD1 and VSS1. Use of two inverters to power capacitors 2 and 7 keeps the loading of clamp 3 as reflected through capacitor 2 from affecting the voltage excursion on node 11, and the loading of clamp 8 as reflected through capacitor 7 from affecting the voltage excursion on node 6. Therefore the two circuits will operate as described earlier.

The outputs of the capacitors 2 and 7 drive the transistors 5 and 10 as before to generate set and reset current pulses for the flip-flop 14. In FIG. 3 the transistor output nodes 12 and 13 have been merged to make a new node 34, which becomes the input to the flip-flop 14. The flip-flop in turn has been made with a back-to-back pair of logic inverters connected in opposition as is known in the state of the art. These are CMOS inverters 13, denoted 35, and 14, denoted 36. Inverter 35 places the complement of the voltage at node 34 on its output 37, and inverter 36 complements that signal again to place it back on node 34. Thus the feedback of inverter 36 to the input of inverter 35 acts to preserve the signal value or logic level at node 34 and keep it static when transistors 5 and 10 are not conducting.

When transistor 5 conducts, it will pull up the voltage on node 34 towards voltage VDD2. This in turn causes node 35 to go to the voltage VSS2. Conversely, when transistor 10 conducts, its will pull the voltage on node 34 towards voltage VSS2, and in turn node 35 will go to the voltage VDD2. In order for the transistors 5 and 10 to be able to effectively change the voltage on node 34, they must have more output current than that which inverter 36 can supply. The sizes of transistors 5 and 10 must be chosen properly in relation to the sizes of the transistors in inverter 36 in order for this requirement to be met. Since inverter 36 only serves the purpose of maintaining the voltage at node 34 during times when changes are not occurring, it is convenient to make the transistors in inverter 36 weaker than in a regular inverter, so that they have relatively small output current capabilities. Therefore the size requirement stated above is easily met.

An additional inverter 15, denoted 38, is shown at the output of the circuit in FIG. 3. This inverter is optional, but can serve a useful purpose of isolating the operation of the level translator from the effects of the load which is attached to the output node 15 at VOUT. A large capacitance attached to the output of inverter 35 would slow down its output voltage transition, and with a large enough capacitance attached, the voltage at node 37 would not be able to reach the switching point required to control inverter 36 before the input signals controlling transistors 5 or 10 went away. In this case, the inverter 36 would not be able to reinforce the logic state generated at node 34 by operation of the transistors 5 and 10, and the circuit would revert to its state which was present before the input signal transition was applied at VIN. Proper function of the circuit would fail as a result. Having inverter 38 present at the output of the circuit prevents this loading effect on node 37, and no value of capacitance loading on node 15 for VOUT would prevent the circuit from switching properly. Loading capacitance would only affect the voltage transition times as seen at the VOUT terminal node 15. If the loading capacitance is small, the inverter 38 may be implemented as one of a multiplicity of inputs of a logic gate or other logic circuit instead of explicitly being present. The isolation function will still be provided by the logic gate. The low capacitance loading of the additional buffering provided by inverter 38 can also serve to speed operation of the complete level translator circuit by reducing the capacitance on node 37.

In some systems, it is essential that the circuit starts in a known state at the output VOUT. For this purpose, an additional reset or set input may be provided on the flip-flop to allow controlling its state. Referring to FIG. 3 again, an additional NMOS transistor M3, denoted 39, is shown for this purpose. When this transistor conducts sufficient current, it will pull down on node 34 to make its voltage equal to VSS2. This has the effect of clearing the state of the flip-flop 14 formed by inverters 35 and 36, so that the output voltage VOUT on node 15 will have the value VSS2. Application of a voltage sufficiently positive relative to VSS2 to the input terminal marked CLEAR for node 40 will cause transistor 39 to turn on and perform this clearance function. A more complicated circuit could be used to perform the same function as transistor without affecting the basic circuit operation. One variation would be to replace either inverter 35 or 36 with a logic gate, such as a NAND gate or a NOR gate. As is obvious to one versed in the state of the art, a PMOS transistor may be used instead of transistor 39 to pull up node 34 to VDD2, causing the VOUT voltage to become VDD2 in this case. A complementary pair of transistors or an inverter capable of having its output current disabled may also be used to directly control node 34, so that node 34 may be set to a voltage of either VSS2 or VDD2 depending on an external logic signal criteria. Other variations know to the state of the art may be applied without affecting the general principle of the circuit operation.

Figure 4:
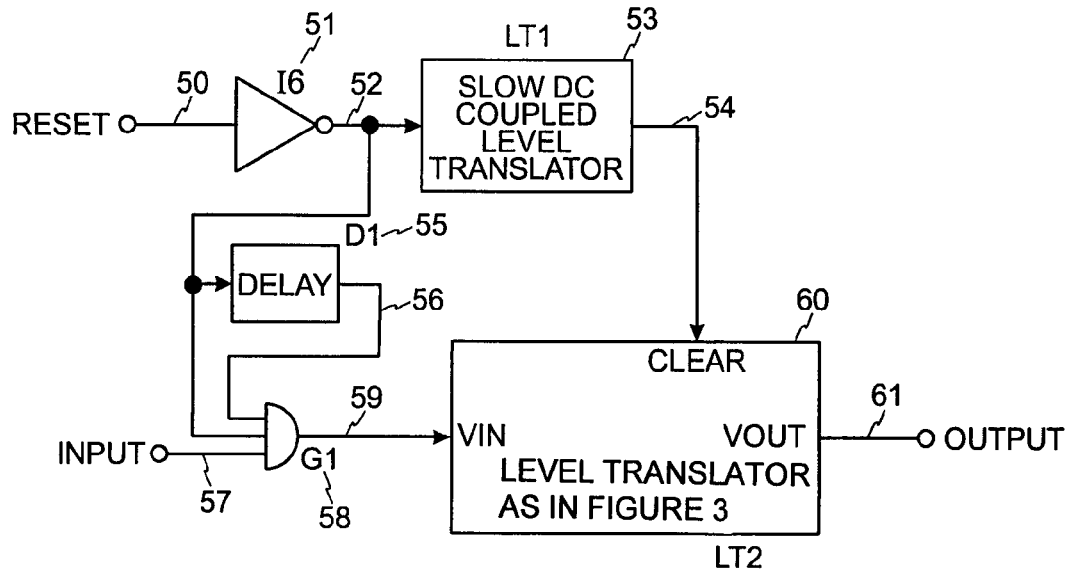
FIG. 4 is a level translator system which incorporates the level translator of FIG. 3 together with additional circuitry to provide an output which more accurately copies the logic state of the input signal INPUT.

Referring to FIG. 4, a level translator system 400 which incorporates the level translator of FIG. 3 together with additional circuitry to provide an output which more accurately copies the logic state of the input signal INPUT on node 57. Additional circuitry is provided to make use of a system RESET pulse on node 50 to properly set the state of the output voltage OUTPUT at node 61. The RESET input on node 50 goes first to an inverter I6, denoted 51, to change its logic state to the complementary function. This signal is then delayed by the delay device D1, denoted 55, as may be made by the state of the art. The resultant delayed signal on node 56 is ideally a copy of the signal on node 52, with additional time delay added. An imperfect delay device may still yield useful results. The signals on nodes 52, 56, and 57 are combined by the AND gate G1, denoted 58, to produce a new signal on node 59. The signal on node 59 will be active or logic high only if the input signal 57 is high and the reset input 50 has been low for some time. When the reset input 50 goes high, the signal at 59 is immediately changed to its inactive state, and when the reset input 50 goes low, the signal at 59 cannot return to its high state until the delayed signal at 56 has gone high.

The time delay of delay device 55 is chosen to be longer than the signal propagation time in the slow DC coupled level translator LT1, denoted 53. This allows time for the signal at node 54, which controls the clear input of level translator LT2, denoted 60 and shown in FIG. 3, to respond to the RESET input state. Therefore at all times when a reset signal is being applied on node 54 to the level translator 60, the input signal VIN on node 59 will be also in a corresponding logic low state. The level translator 53 has some signal propagation delay, and the delay device 55 is chosen to have more time delay than the level translator 53. By the means just described the output signal OUTPUT of level translator 60 on node 61 may be caused to correspond to the input signal on node 57 after a reset pulse is applied and removed on node 50.

Figure 5:
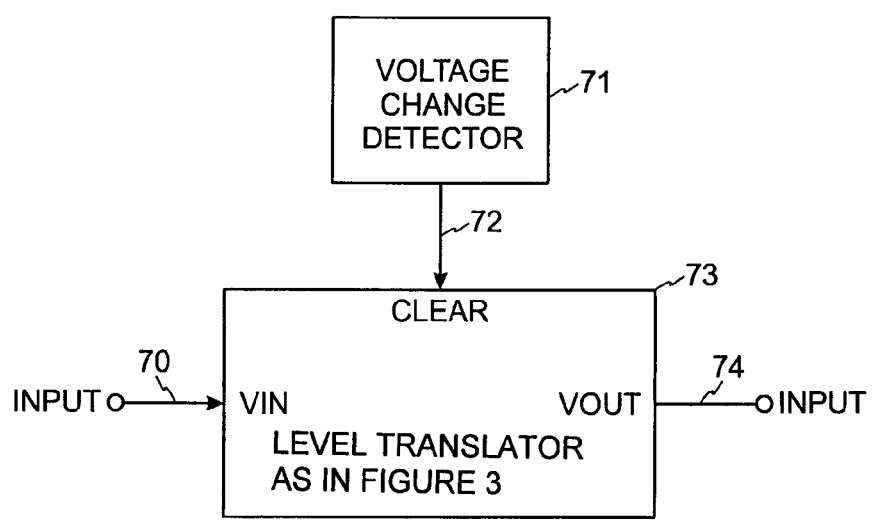
FIG. 5 shows another alternative method of ensuring that the output of the level translator of FIG. 3 produces an output which is always suitable for the system employing it.

Referring to FIG. 5, another alternative method of ensuring that the output of the level translator of FIG. 3 produces an output which is always suitable for the system employing it. In this case a voltage change detector 71 uses predetermined criteria to decide when to clear the output of the level translator 73 to a known value. This voltage detector may respond to the absolute value of one or more of the power supply voltages in the system. This could provide a reset or clear signal to the level translator whenever the system is being powered up or down, for example. It could also respond to the rate of change of one or more of the power supply voltages in the system. In this case, if a power supply voltage change caused excessive rate of change for the voltage across capacitors 2 and 7 in FIG. 3, the circuit would clear the output of the level translator to a value safe for system operation. The clearing action prevents rapid voltage changes, noise, or glitches on the power supplies from being interpreted as valid signal inputs by the transistors 5 and 10 in FIG. 3, and prevents improper operation of the circuit.

Figure 6:
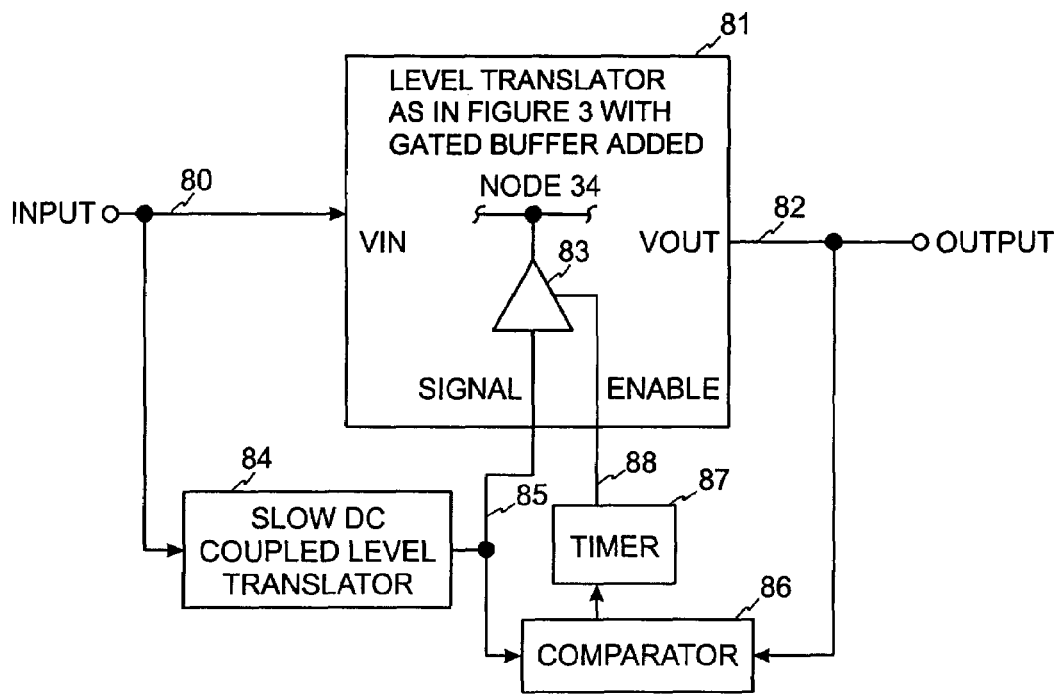
FIG. 6 shows a level translator provided with automatic correction of its output.

Referring to FIG. 6, a level translator 600 provided with automatic correction of its output is shown. A slow DC coupled level translator is used in parallel with the fast level translator of FIG. 3 to make the input signal state available to the correction circuit. The input signal on node 80 is first put through the level translator 84 to provide a logic signal on node 85 at the DC levels used by the remaining circuits. A comparator 86 can then compare the logic state of the fast level translator output 81 on node 82 with the translated and delayed input signal on node 85. When a mismatch occurs for more than some predetermined time interval, the timer 87 will enable the gated buffer 83 to allow its output to take control of the internal node 34 of the level translator of FIG. 3. In this way the output state 82 of level translator 81 will be brought into correspondence with the input signal 80. Correction of the level translator 81 output will in general only have to occur occasionally, when major changes in the system operation occur, such as application or removal of power or input signals. The correction circuit is normally not active, and will not impair the fast transfer of signals from the input 80 to the output 82.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A level translator comprising:
   a pair of transistors, wherein a first transistor of the pair of transistors and a second transistor of the pair of transistors are complimentary;
   a pair of capacitors, wherein a first capacitor of the pair of capacitors is coupled to a voltage input VIN and to a gate of a first transistor of the pair of complimentary transistors and a second capacitor of the pair of capacitors coupled the voltage input VIN and to a gate of a second transistor of the pair of complimentary transistors;
   a flip flop device having a first input coupled to a drain of the first transistor, and a second input coupled to a drain of the second transistor,
   a pair of resistors, wherein a first resistor of the pair of resistors is coupled to the gate of the first transistor and to a voltage supply of VDD, and a second resistor of the pair of resistors is coupled to the gate of the second transistor and to a voltage supply VSS; and a pair of clamping circuits, wherein a first clamping circuit of the pair of clamping circuits is coupled to the gate of the first transistor and to a voltage supply of VDD, and a second clamping circuit of the pair of clamping circuits is coupled to the gate of the second transistor and to a voltage supply VSS;

wherein a source of the first transistor is connected to a first pole of a power source, a source of the second transistor is connected to a second pole of the power source, a drain of the first transistor is connected to a first input of the flip-flop, a drain of the second transistor is connected to a second input of the flip-flop, a gate of the first transistor being further connected to the first clamp circuit, and a gate of the second transistor being further connected to the second clamp circuit;

wherein an additional at least one of a reset or set input is provided on the flip-flop for determining the state of the flip-flop at an arbitrary time; and wherein a voltage change detector is coupled to the flip flop to control at least one of a reset or set input of the flip-flop.

2. A level translator in accordance with claim 1 wherein the pair of complimentary transistors comprises a pair of complimentary MOS transistors.

3. A level translator in accordance with claim 1, wherein the flip-flop is made with two CMOS inverters connected in opposition to form a memory circuit with two stable states.

4. A level translator in accordance with claim 1, wherein at least one output of the flip-flop is connected to an input of at least one of a logic gate or an inverter.

5. A complementary MOS field effect transistor amplifier for AC input signals, comprising:
 a voltage detection circuit comprising:
  a first transistor having a first predetermined voltage threshold; and
  a second transistor having a second predetermined voltage threshold, the first and second transistors having control gates and being of complementary conductivity;
 a first coupling capacitor coupled to the gate of the first transistor;
 a second coupling capacitor coupled to the gate of the second transistor;
 a first resistor coupled to the gate of the first transistor and to a source of the first transistor;
 a second resistor coupled to the gate of the second transistor and to a source of the second transistor;
 a first clamp circuit coupled to the gate of the first transistor for limiting a gate voltage of the first transistor; and
 a second clamp circuit coupled to the gate of the second transistor for limiting a gate voltage of the second transistor;
 wherein the source of the first transistor is connected to a first pole of a power source, the source of the second transistor is connected to a second pole of the power source, the drain of the first transistor is connected to a first input of a flip-flop, the drain of the second transistor is connected to a second input of the flip-flop, the gate of the first transistor being further connected to the first clamp circuit, and the gate of the second transistor being further connected to the second clamp circuit;
 wherein an additional at least one of a reset or set input is provided on the flip-flop for determining the state of the flip-flop at an arbitrary time; and
 wherein a voltage change detector is coupled to the flip flop to control at least one of a reset or set input of the flip-flop.

6. A complementary MOS field effect transistor amplifier for AC input signals in accordance with claim 5, wherein the first and second inputs of the flip-flop are connected to a same node, the flip-flop state being determined by whether current is forced into or out of the same node.

7. A complementary MOS field effect transistor amplifier for AC input signals in accordance with claim 6, wherein the flip-flop comprises a pair of CMOS inverters connected in opposition to form a memory circuit with two stable states.

8. A complementary MOS field effect transistor amplifier for AC input signals in accordance with claim 5, wherein at least one output of the flip-flop is connected to an input of at least one of a logic gate or an inverter.

9. A complementary MOS field effect transistor amplifier for AC input signals in accordance with claim 5, wherein output voltages of the first and second clamp circuits are chosen to minimize current consumption of the amplifier for a given load.

10. A complementary MOS field effect transistor amplifier for AC input signals in accordance with claim 5, wherein at least one of the first and second clamp circuits contains a MOS transistor.

11. A complementary MOS field effect transistor amplifier for AC input signals in accordance with claim 5, wherein the first and second capacitors are driven by the same signal source.

12. A complementary MOS field effect transistor amplifier for AC input signals in accordance with claim 5, wherein at least one of the resistors is made with an MOS transistor.

13. A complementary MOS field effect transistor amplifier for AC input signals, comprising:
 a voltage detection circuit comprising:
  a first transistor having a first predetermined voltage threshold; and
  a second transistor having a second predetermined voltage threshold, the first and second transistors having control gates and being of complementary conductivity;
 a first coupling capacitor coupled to the gate of the first transistor;
 a second coupling capacitor coupled to the gate of the second transistor;
 a first resistor coupled to the gate of the first transistor and to a source of the first transistor;
 a second resistor coupled to the gate of the second transistor and to a source of the second transistor;
 a first clamp circuit coupled to the gate of the first transistor for limiting a gate voltage of the first transistor; and
 a second clamp circuit coupled to the gate of the second transistor for limiting a gate voltage of the second transistor;
 wherein the source of the first transistor is connected to a first pole of a power source, the source of the second transistor; is connected to a second pole of the power source, the drain of the first transistor is connected to a first input of a flip-flop, the drain of the second transistor is connected to a second input of the flip-flop, the gate of the first transistor being further connected to the first clamp circuit, and the gate of the second transistor being further connected to the second clamp circuit;
 wherein an additional at least one of a reset or set input is provided on the flip-flop for determining the state of the flip-flop at an arbitrary time; and wherein a DC coupled level translator is used to control at least one of a reset or set input of the flip-flop.

14. A complementary MOS field effect transistor amplifier for AC input signals in accordance with claim 13, wherein the first and second inputs of the flip-flop are connected to a same node, the flip-flop state being determined by whether current is forced into or out of the same node.

15. A complementary MOS field effect transistor amplifier for AC input signals in accordance with claim 14, wherein output voltages of the first and second clamp circuits are chosen to minimize current consumption of the amplifier for a given load.

16. A complementary MOS field effect transistor amplifier for AC input signals in accordance with claim 14, wherein an additional at least one of a reset or set input is provided on the flip-flop for determining the state of the flip-flop at an arbitrary time.

17. A complementary MOS field effect transistor amplifier for AC input signals in accordance with claim 13, wherein the flip-flop comprises a pair of CMOS inverters connected in opposition to form a memory circuit with two stable states.

18. A complementary MOS field effect transistor amplifier for AC input signals in accordance with claim 14, wherein at least one output of the flip-flop is connected to an input of at least one of a logic gate or an inverter.

19. A complementary MOS field effect transistor amplifier for AC input signals in accordance with claim 13, wherein a logic state comparator is used to determine a correspondence of an output of the DC coupled level translator to the output of the amplifier.

20. A complementary MOS field effect transistor amplifier for AC input signals in accordance with claim 19, wherein a timer is used to determine when the output of the logic state comparator is used.

* * * * *